(12) United States Patent
Lee et al.

(10) Patent No.: US 8,194,026 B2
(45) Date of Patent: Jun. 5, 2012

(54) GATE DRIVER AND DISPLAY APPARATUS HAVING THE SAME

(75) Inventors: Hong-Woo Lee, Cheonan-si (KR); Myung-Koo Hur, Cheonan-si (KR); Jong-Hwan Lee, Anyang-si (KR); Beom-Jun Kim, Seoul (KR); Sung-Man Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1218 days.

(21) Appl. No.: 11/782,957

(22) Filed: Jul. 25, 2007

(65) Prior Publication Data

US 2008/0036725 A1    Feb. 14, 2008

(30) Foreign Application Priority Data

Aug. 8, 2006    (KR) .................. 10-2006-0074583

(51) Int. Cl.
*G09G 3/36*    (2006.01)
(52) U.S. Cl. ......................................... 345/100; 257/72
(58) Field of Classification Search .................. 345/100; 257/72
See application file for complete search history.

(56) References Cited

U.S. PATENT DOCUMENTS

| 5,815,444 | A | * | 9/1998 | Ohta | ..................... 365/189.05 |
| 6,052,426 | A | | 4/2000 | Maurice | |
| 2003/0231735 | A1 | * | 12/2003 | Moon et al. | ..................... 377/64 |
| 2004/0109526 | A1 | * | 6/2004 | Park et al. | ..................... 377/64 |
| 2004/0189585 | A1 | | 9/2004 | Moon | |
| 2005/0008114 | A1 | | 1/2005 | Moon | |
| 2006/0022201 | A1 | * | 2/2006 | Kim et al. | ..................... 257/72 |
| 2006/0145999 | A1 | * | 7/2006 | Cho et al. | ..................... 345/100 |

OTHER PUBLICATIONS

Extended European Search Report dated Nov. 27, 2007.

* cited by examiner

*Primary Examiner* — Quan-Zhen Wang
*Assistant Examiner* — Yuk Chow
(74) *Attorney, Agent, or Firm* — H.C. Park & Associates, PLC

(57) ABSTRACT

A gate driver comprises a shift register that has a plurality of stages connected together and outputs a gate signal comprising a first pulse and a second pulse to a gate line. A stage includes a holding part, a pre-charging part, a pull-up part, and a pull-down part. The holding part discharges an output terminal to an off-voltage in response to a first clock signal. The pre-charging part turns off the holding part and outputs the first clock signal as the first pulse to the output terminal in response to an output signal of a previous stage. The pull-up part outputs a second clock signal as the second pulse to the output terminal in response to the output signal of the previous stage. The pull-down part discharges the first output terminal to the off-voltage in response to an output signal of a next stage.

22 Claims, 8 Drawing Sheets

GATE DRIVER AND DISPLAY APPARATUS HAVING THE SAME

This application claims priority from and the benefit of Korean Patent Application No. 10-2006-0074583, filed on Aug. 8, 2006, which is hereby incorporated by reference for all purposes as if fully set forth herein.

BACKGROUND OF THE INVENTION

1. Field of the Invention

The present invention relates to a gate driver and a display apparatus having the gate driver. More particularly, the present invention relates to a gate driver capable of reducing driving defects resulting from increasing driving frequency, and a display apparatus having the gate driver.

2. Discussion of the Background

Generally, a liquid crystal display ("LCD") apparatus includes an array substrate, a counter substrate and a liquid crystal layer disposed between the array substrate and the counter substrate. The liquid crystal layer includes liquid crystal molecules having an anisotropic dielectric constant. In the LCD apparatus, an electric field is applied to the liquid crystal molecules, and a light transmissivity is controlled by the alignment of the liquid crystal molecules according to an intensity of the electric field. Thus, in response to the alignment of the liquid crystal molecules, light may pass through the liquid crystal layer so that an image is displayed.

The LCD apparatus includes a display panel, a gate driver, and a data driver. The display panel includes a plurality of pixel portions defined by gate lines extending in a first direction and data lines extending in a second direction and arranged to cross with the gate lines. The gate driver outputs a gate signal to the gate lines, and the data driver outputs a data signal to the data lines. Generally, the gate driver and the data driver are chips mounted on the display panel.

Recently, in order to decrease total size of the LCD apparatus and increase productivity of the LCD apparatus, the gate driver is an integrated circuit directly integrated on the display panel, and research for a display panel capable of reducing the number of driving chips has been performed.

Specifically, as driving frequency of a gate signal increases, a pulse width of the gate signal decreases. When the pulse width of the gate signal decreases, the gate signal may be dropped as a result of a delay in the transmission of the signal. Therefore, there may be insufficient time to charge a pixel part by the data signal and driving defects may result.

SUMMARY OF THE INVENTION

The present invention provides a gate driver capable of reducing driving defects induced by increasing driving frequency.

The present invention also provides a display apparatus having the above gate driver.

Additional features of the invention will be set forth in the description which follows, and in part will be apparent from the description, or may be learned by practice of the invention.

The present invention discloses gate driver including a shift register having an (m−1)-th stage, an m-th stage, and an (m+1)-th stage connected together An m-th stage includes a first holding part to discharge a first output terminal to an off-voltage in response to a first clock signal, a pre-charging part to turn off the first holding part and to output the first clock signal to the first output terminal in response to an output signal of the (m−1)-th stage, a pull-up part to output a second clock signal to the first output terminal in response to the output signal of the (m−1)-th stage, and a pull-down part to discharge the first output terminal to the off-voltage in response to an output signal of the (m+1)-th stage. Further, m is a natural number.

The present invention also discloses a display apparatus including a display panel, a data driver to output a data signal to data lines, and a gate driver to output a gate signal comprising a first pulse and a second pulse to gate lines, the gate driver being arranged in a peripheral area of the display apparatus and comprising an (m−1)-th stage, an m-th stage, and an (m+1)-th stage connected together. The display panel also includes a display area having a plurality of pixels electrically connected to the gate lines and the data lines. The m-th stage of the gate driver includes a first holding part to discharge a first output terminal to an off-voltage in response to a first clock signal, a pre-charging part to turn off the first holding part and to output the first clock signal to the first output terminal to form the first pulse in response to a output signal of (m−1)-th stage, a pull-up part to output a second clock signal to the first output terminal to form the second pulse in response to the output signal of the (m−1)-th stage, and a pull-down part to discharge the first output terminal to the off-voltage in response to an output signal of (m+1)-th stage. Further, m is a natural number.

It is to be understood that both the foregoing general description and the following detailed description are exemplary and explanatory and are intended to provide further explanation of the invention as claimed

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
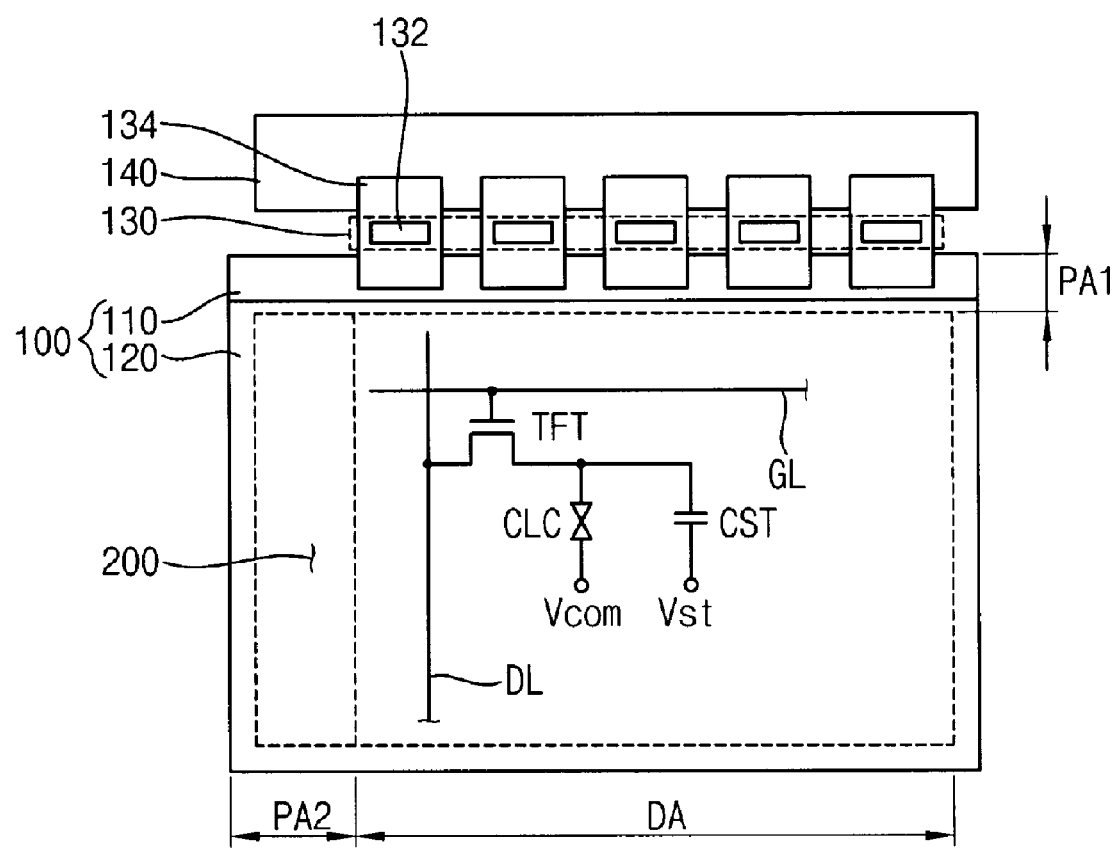
FIG. 1 is a plan view of a display apparatus according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer, either electrically or mechanically, or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, exemplary embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

FIG. 1 is a plan view of a display apparatus according to an exemplary embodiment of the present invention.

Referring to FIG. 1, the display apparatus according to the present exemplary embodiment includes a display panel 100, a gate driver 200, and a data driver 130 for driving the display panel 100.

The display panel 100 includes an array substrate 110, a counter substrate 120 such as a color filter substrate separated from and facing the array substrate, and a liquid crystal layer (not shown) arranged between the array substrate 110 and the counter substrate 120. The display panel 100 includes a display area DA, a first peripheral area PA1, and a second peripheral area PA2. The first peripheral area PA1 and the second peripheral area PA2 are arranged along edges of the display area DA.

The display area DA includes gate lines GL extending in a first direction, data lines DL extending in a second direction crossing with the first direction, and a plurality of pixel portions being defined by the gate lines GL and the data lines DL and being arranged in a matrix shape for displaying an image.

A thin film transistor TFT, a liquid crystal capacitor CLC, and a storage capacitor CST are arranged on each pixel portion. For clarity, these components are shown in FIG. 1 for a single pixel. A gate electrode of the thin film transistor TFT is connected to the gate line GL, a source electrode of thin film transistor TFT is connected to the data line DL, a drain electrode of thin film transistor TFT is connected to a first electrode of the liquid crystal capacitor CLC and an electrode of the storage capacitor CST. A second electrode of the liquid crystal capacitor CLC may be connected to a common voltage Vcom. A second electrode of the storage capacitor CST may be connected to a storage voltage Vst.

The first peripheral area PA1 is disposed at an end of the data lines DL, and the second peripheral area PA2 is disposed at an end of the gate lines GL.

The data driver 130 outputs data signals to the data lines DL when a gate signal is applied to the gate lines GL. The data driver 130 includes at least one data driving chip 132. The data driving chip 132 may be arranged on a flexible circuit board 134. A first end of the flexible circuit board 134 is connected to the first peripheral area PA1 of the display panel 100, and a second end of the flexible circuit board 134 is connected to a printed circuit board 140. Namely, the data driving chip 132 is connected to the printed circuit board 140 and the display panel 100 through the flexible circuit substrate 134.

The gate driver 200 includes a shift register having stages that may be cascade-connected to each other. The gate driver 200 sequentially outputs a gate signal having a first pulse and a second pulse to the gate lines GL. The gate driver 200 may be arranged on the second peripheral area PA2 of the display panel 100 as an integrated circuit. A gate driver 200 integrated on the display panel 100 may have a three-metal layered structure including molybdenum (Mo), aluminum (Al), and molybdenum (Mo) for enhancing a driving margin.

Figure 2:
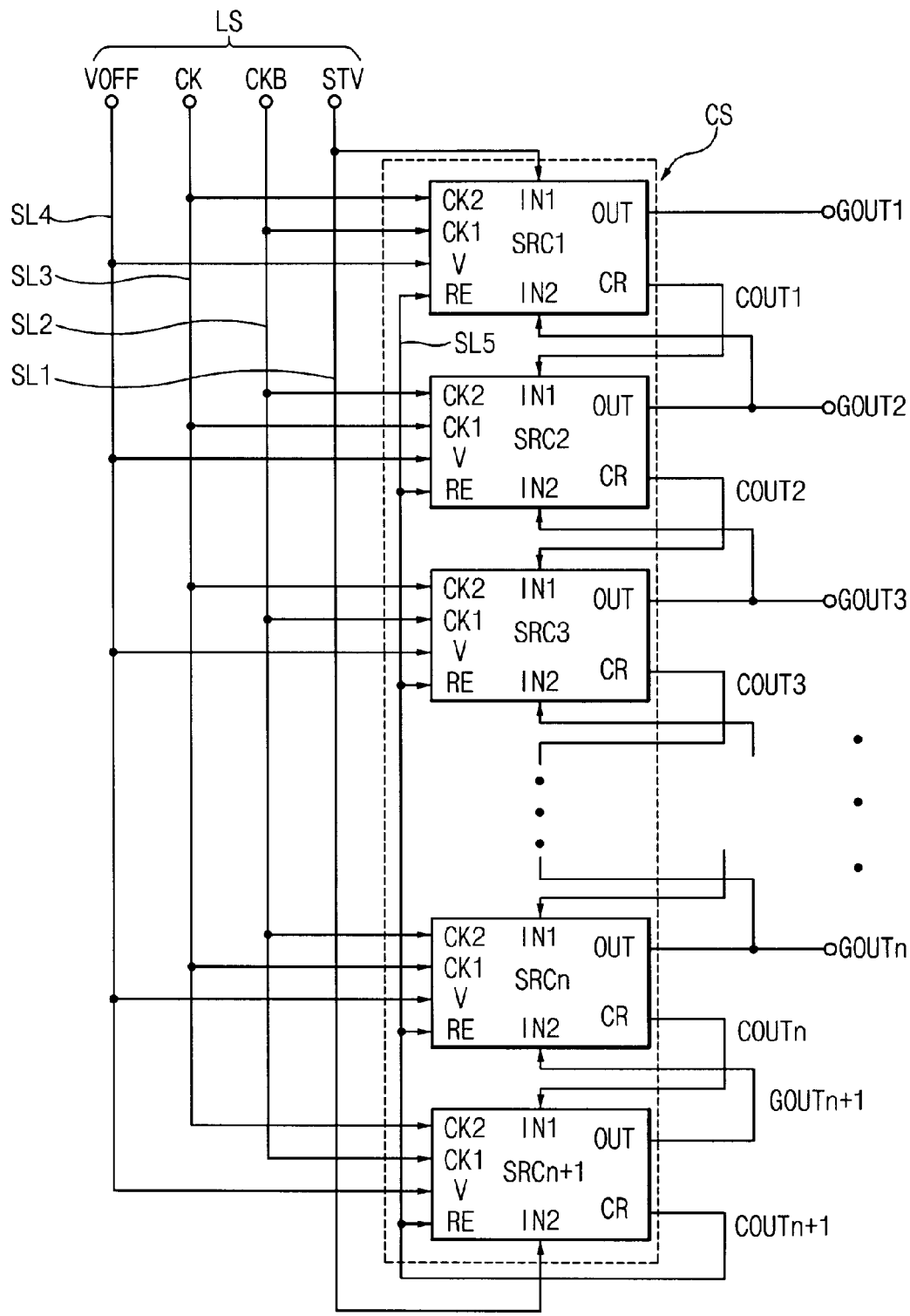
FIG. 2 is a block diagram of a gate driver having cascade-connected stages according to a first exemplary embodiment of the present invention.

FIG. 2 is a block diagram of a gate driver having cascade-connected stages according to a first exemplary embodiment of the present invention.

Referring to FIG. 2, the gate driver 200 according to the first exemplary embodiment includes a circuit section CS and a line section LS. The circuit section CS includes first to (n+1)-th stages SRC1 to SRCn+1 that are cascade-connected to each other to sequentially output a gate signal GOUT1 to GOUTn+1. The line section LS is arranged along an end of the circuit section CS and provides the circuit section CS with a synchronizing signal and a driving voltage, which will be described in additional detail below.

The first to n-th stages SRC1 to SRCn correspond to driving stages, and the (n+1)-th stage SCRn+1 corresponds to a dummy stage. Each of the first to (n+1)-th stages SRC1 to SRCn+1 includes a first clock terminal CK1, a second clock terminal CK2, a first input terminal IN1, a second input terminal IN2, a voltage terminal V, a reset terminal RE, a first output terminal OUT, and a second output terminal CR. A signal of the first output terminal OUT is defined as a gate signal GOUT, and a signal of the second output terminal CR is defined as a carry signal COUT.

The first clock terminal CK1 and the second clock terminal CK2 of a m-th stage SRCm receive a first clock signal CKB and a second clock signal CK, wherein 'm' is an integer equal to or less than n+1. The first clock signal CKB and the second clock signal CK are reversed by one horizontal period (1 H), which may be equal to one-half of the period of the first clock signal CKB or the second clock signal CK. The first clock signal CKB has phase opposite to the phase of the second clock signal CK.

In more detail, the first clock signal CKB is provided to the first clock terminal CK1 of odd-numbered stages SRC1, SRC3, . . . of the first to (n+1)-th stages SRC1 to SRCn+1, and a second clock signal CK having a phase opposite to the phase of the first clock signal CKB is provided to the second clock terminal CK2 of the odd-numbered stages SRC1, SRC3, . . . of the first to (n+1)-th stages SRC1 to SRCn+1. The second clock signal CK is provided to the first clock terminal CK1 of even-numbered stages SRC2, SRC4, . . . of the first to (n+1)-th stages SRC1 to SRC(n+1), and the first clock signal CKB having a phase opposite to the phase of the second clock signal CK is provided to the second clock terminal CK2 of the even-numbered stages SRC2, SRC4, . . . of the first to (n+1)-th stages SRC1 to SRCn+1.

A vertical start signal STV or the carry signal COUTm−1 of an (m−1)-th stage is provided as a vertical start signal to the first input terminal IN1 of an m-th stage SRCm. For example, the vertical start signal STV is provided to the first input terminal IN1 of the first stage SRC1, and the carry signals COUT1 to COUTn of the stages SRC1 to SRCn are respectively provided as vertical start signals to the first input terminal IN1 of the second to (n+1)-th stages SRC2 to SRCn+1.

The gate signal GOUTm+1 of (m+1)-th stage or the vertical start signal STV is provided as a vertical start signal to the second input terminal IN2 of m-th stage SRCm. Namely, the gate signals of second to (n+1)-th stages SRC2 to SRCn+1 are respectively provided as vertical start signals to the second input terminal IN2 of the first to n-th stages SRC1 to SRCn, and the vertical start signal STV is provided to the second input terminal IN2 of a final stage SRCn+1.

An off-voltage VOFF is provided to a voltage terminal V of m-th stage SRCm, and the off-voltage VOFF may have a voltage level between about −5 Volts and −7 Volts.

The carry signal COUTn+1 of the final stage SRCn+1 is provided to the reset terminal RE of the m-th stage.

A high-level second clock signal CK or a high-level first clock signal CKB provided to the second clock terminal CK2 is output to the first output terminal OUT of the m-th stage SRCm. For example, the high-level second clock signal CK is output to the first output terminal OUT of the odd-numbered stages, and the high-level first clock signal CKB is output to the first output terminal OUT of the even-numbered stages. Therefore, the first to (n+1)-th stages SRC1 to SRCn+1 can sequentially output the gate signal GOUT1 to GOUTn+1.

The carry signal COUTm is output to the second output terminal CR of m-th stage SRCm. A high-level second clock signal CK or a high-level first clock signal CKB, which are provided to the second clock terminal CK2, is output to the second output terminal CR of m-th stage SRCm.

The gate driver 200 includes a line section LS arranged along one side of the circuit section CS. The line section LS includes lines for providing a synchronization signal and a driving voltage to the first to (n+1)-th stages SRC1 to SRCn+1. The line section LS includes a start signal line SL1, a first clock line SL2, a second clock line SL3, a voltage line SL4 and a reset line SL5.

The start signal line SL1 receives the vertical start signal STV and provides the vertical start signal STV to the first input terminal IN1 of the first stage SRC1 and the second input terminal IN2 of the final stage SRCn+1.

The first clock line SL2 receives first clock signal CKB and provides the first clock signal CKB to the first clock terminal CK1 of the odd-numbered stages and the second clock terminal CK2 of the even-numbered stages. A level of the first clock signal CKB alternates between a high level and a low level by a period 1 H.

The second clock line SL3 receives the second clock signal CK having the opposite phase to that of the first clock signal CKB and provides the second clock signal CK to the second clock terminal CK2 of the odd-numbered stages and the first clock terminal CK1 of the even-numbered stages.

The voltage line SL4 receives the off-voltage VOFF and provides the off-voltage VOFF to the voltage terminal V of the first to (n+1)-th stages SRC1 to SRCn+1. Namely, the voltage line SL4 provides the voltage terminal V of all stages with the off-voltage VOFF.

The reset line SL5 receives the carry signal COUTn+1 from the (n+1)-th stage SRCn+1 and provides the carry signal COUTn+1 to the reset terminals RE of the first to (n+1)-th stages SRC1 to SRCn+1.

Figure 3:
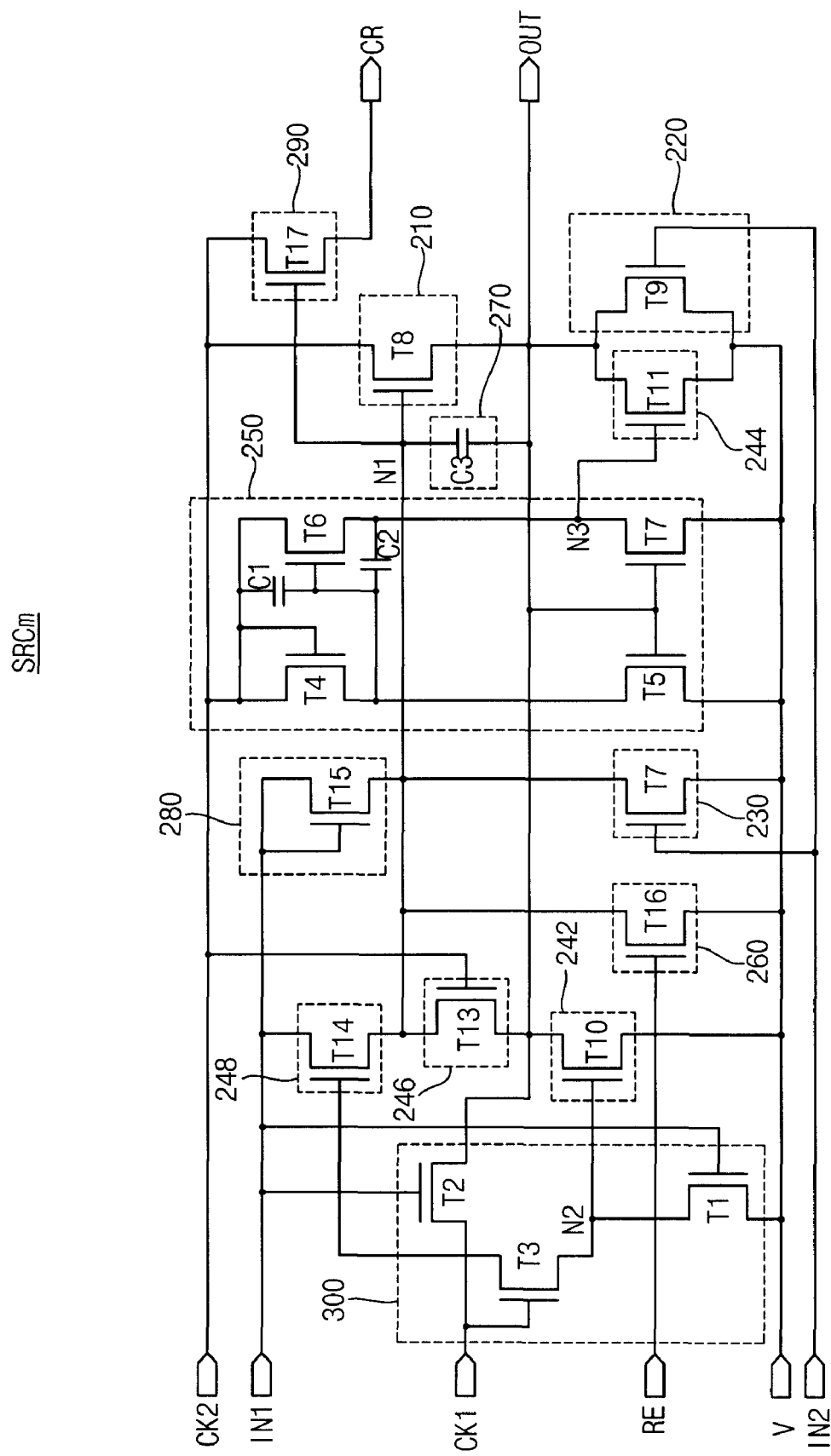
FIG. 3 is a detailed circuit diagram of a stage shown in FIG. 2.
Figure 4:
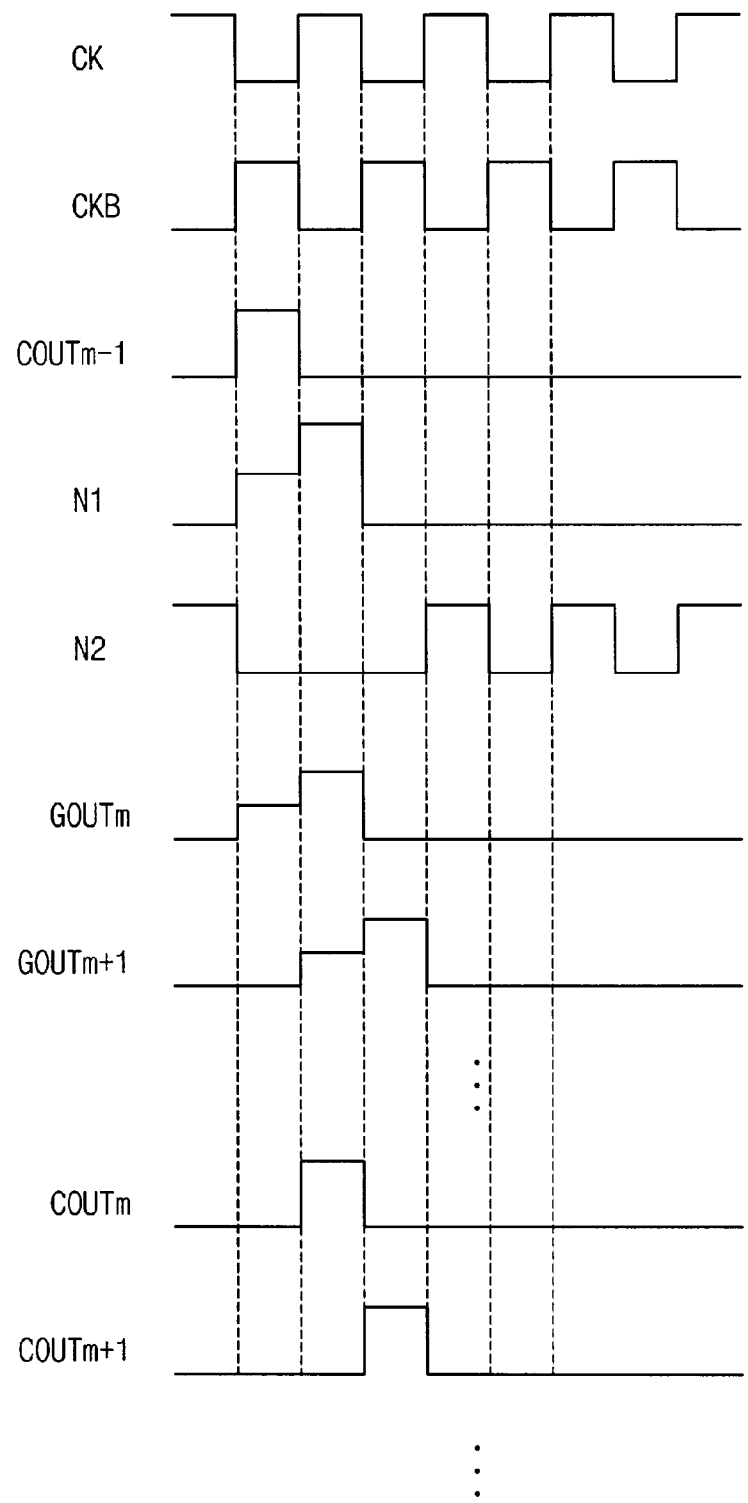
FIG. 4 is a signal waveform diagram for a stage shown in FIG. 3.

FIG. 3 is a detailed circuit diagram of a stage shown in FIG. 2, and FIG. 4 is a signal waveform diagram for the stage in FIG. 3.

For convenience, the m-th stage SRCm shown in FIG. 3 shall be described as an odd numbered stage such as SRC3 such that the first clock terminal CK1 receives the first clock signal CKB and the second clock terminal CK2 receives the second clock signal CK.

Referring to FIG. 3 and FIG. 4, the gate driver 200 according to the first exemplary embodiment of the present invention includes the m-th stage SRCm, which includes a pull-up part 210 and a pull-down part 220. The pull-up part 210 outputs a high-level second clock signal CK to the first output terminal OUT. Namely, the pull-up part 210 pulls up the m-th gate signal GOUTm output to the first output terminal OUT to the high level of the second clock signal CK. The pull-down part 220 discharges the first output terminal OUT to the off-voltage VOFF in response to the output signal of the (m+1)-th stage SRCm+1. Namely, the pull-down part 220 pulls down the m-th gate signal GOUTm to the off-voltage VOFF in response to the gate signal GOUTm+1 of the (m+1)-th stage.

The pull-up part 210 includes an eighth transistor T8 having a drain electrode connected to the second clock terminal CK2 to receive the second clock signal CK, and a source electrode connected to the first output terminal OUT.

The pull-down part 220 includes a ninth transistor T9 having a drain electrode connected to the first output terminal OUT, and a source electrode connected to the voltage terminal V and receiving the off-voltage VOFF.

The m-th stage further includes a pull-up driving part including a buffer part 280, a charging part 270 and a discharging part 230. The pull-up driving part turns on the pull-up part 210 in response to the (m−1)-th carry signal COUTm−1 of the (m−1)-th stage SRCm−1, and turns off the pull-up part 210 in response to the (m+1)-th gate signal GOUTm+1 of the (m+1)-th stage SRCm+1.

The buffer part 280 includes a fifteenth transistor T15. The fifteenth transistor T15 has a gate electrode and a drain electrode connected to the first input terminal IN1, and a source electrode connected to a first node N1. The first node N1 is connected to a gate electrode of the eighth transistor T8 and can be defined as a control node to turn the pull-up part 210 on and off.

The charging part 270 includes a third capacitor C3 having a first electrode connected to the first node N1 and a second electrode connected to the first output terminal OUT.

The discharging part 230 includes a twelfth transistor T12 having a gate electrode connected to the second input terminal IN2, a drain electrode connected to the first node N1, and a source electrode connected to the voltage terminal V to receive the off-voltage VOFF.

In this pull-up driving part, when the fifteenth transistor T15 is turned on in response to the (m−1)-th carry signal COUTm−1, the (m−1)-th carry signal COUTm−1 is applied to the first node N1 and the third capacitor C3 is charged. Then, when the third capacitor C3 is charged to a voltage exceeding a threshold voltage of the eighth transistor T8, and when the low-level second clock signal CK shifts to have a high level, the eighth transistor T8 becomes a bootstrap and turns on to output the high-level second clock signal CK to the output terminal OUT.

That is, after a period of 1 H has passed since the (m−1)-th carry signal is applied, the eighth transistor T8 becomes a bootstrap and a second pulse of the m-th gate signal GOUTm output from the m-th stage SRCm is formed. Then, when the twelfth transistor T12 is turned on in response to the (m+1)-th gate signal GOUTm+1, the third capacitor C3 is discharged to the off-voltage VOFF and the eighth transistor T8 is turned off.

The m-th stage SRCm further includes a first holding part 242, a second holding part 244 and a switching part 250. The first holding part 242 and the second holding part 244 maintain the m-th gate signal GOUTm output to the first output terminal OUT at a level of the off-voltage VOFF. The switching part 250 turns the second holding part 244 on and off.

The first holding part 242 discharges the first output terminal OUT to the off-voltage VOFF in response to a level of the second node N2 according to the first clock signal CKB. The first holding part 242 includes a tenth transistor T1 having a gate electrode connected to the second node N2, a drain electrode connected to the first output terminal OUT, and a source electrode connected to the voltage terminal V to receive the off-voltage VOFF.

The second holding part 244 includes an eleventh transistor T11. The eleventh transistor T11 includes a gate electrode connected to a third node N3 connected to the switching part 250, a drain electrode connected to the first output terminal OUT, and a source electrode connected to the voltage terminal V to receive the off-voltage VOFF.

The switching part 250 includes a fourth transistor T4, a fifth transistor T5, a sixth transistor T6, a seventh transistor T7, a first capacitor C1, and a second capacitor C2.

The fourth transistor T4 has a gate electrode and drain electrode, which are connected to the second clock terminal CK2 to receive the second clock signal CK, and a source electrode connected to a drain electrode of the fifth transistor T5. The fifth transistor T5 has a gate electrode connected to the first output terminal OUT and a source electrode connected to the voltage terminal V to receive the off-voltage VOFF. The sixth transistor T6 has a drain electrode connected to the second clock terminal CK2, a gate electrode connected to the second clock terminal CK2 through the first capacitor C1, and a source electrode connected to a drain electrode of the seventh transistor T7. Therefore, the drain electrode and the gate electrode of the sixth transistor T6 receive the second clock signal CK. The second capacitor C2 is disposed between the gate electrode and the source electrode of the sixth transistor T6. The seventh transistor T7 has a gate electrode connected to the first output terminal OUT, a drain electrode connected to the source electrode of the sixth transistor T6, and a source electrode connected to the voltage terminal V to receive the off-voltage VOFF.

The source electrode of the sixth transistor T6 and the drain electrode of the seventh transistor T7 are connected to the gate electrode of the second holding part 244 and form the third node N3. The second holding part 244 is turned on and off according to the level of the third node N3.

Hereinafter, above-mentioned operations of the switching part 250 will be described. The fourth transistor T4 and the sixth transistor T6 are turned on by the second clock signal CK provided to the second clock terminal CK2. When the second clock signal CK is output to the first output terminal OUT, a level of the first output terminal OUT is converted to a high level and the fifth transistor T5 and the seventh transistor T7 are turned on. Accordingly, voltages output from the fourth transistor T4 and the sixth transistor T6 are discharged to the off-voltage VOFF through the fifth transistor T5 and the seventh transistor T7. Therefore, the signal of the third node N3 maintains a low level that the eleventh transistor T11 is turned off.

Then, when the m-th gate signal GOUTm is discharged to the off-voltage VOFF in response to the (m+1)-th gate signal GOUTm+1, the voltage of the first output terminal OUT gradually drops to a low level. Therefore, the fifth transistor T5 and the seventh transistor T7 are turned off, and the voltage of the third node N3 is converted to the high level by the voltage output from the fourth transistor T4 and the sixth transistor T6. Accordingly, when the voltage of the third node N3 is converted to a high level, the eleventh transistor T11 is turned on, and the voltage of the first output terminal OUT is rapidly discharged to the off-voltage VOFF.

Then, when the second clock signal CK is converted to a low level, the voltage of the third node N3 is also converted to the low level so the eleventh transistor T11 is turned off. However, the tenth transistor T10 is turned on by the first clock signal CKB having the reversed phase to that of the second clock signal CK, so that the voltage of the first output terminal OUT is discharged to the off-voltage VOFF.

In response to the first clock signal CKB and the second clock signal CK the first holding part 242 and the second holding part 244, respectively, sequentially discharge the first output terminal OUT to the off-voltage VOFF. The first holding part 242 does not discharge the off-voltage VOFF to the first output terminal OUT during a pull-up interval in which the second clock signal CK is output to the first output terminal OUT, regardless of a level of the second clock signal CK.

The m-th stage SRCm of the gate driver 200 further includes a pre-charging part 300.

The pre-charging part 300 turns off the first holding part 242 in response to the (m−1)-th carry signal COUTm−1 of the (m−1)-th stage SRCm−1, and outputs the first clock signal CKB to the first output terminal OUT so the pre-charging part 300 performs pre-charging. Specifically, the pre-charging part 300 outputs the first clock signal CKB to the first output terminal OUT in response to the (m−1)-th carry signal COUTm−1 and forms the first pulse having a first level of the m-th gate signal GOUTm for performing pre-charging.

The pre-charging part 300 includes a first transistor T1, a second transistor T2, and a third transistor T3.

The first transistor T1 includes a drain electrode connected to a gate electrode of the tenth transistor T10 to define the second node N2, a gate electrode connected to the first input terminal IN1 to receive the (m−1)-th carry signal COUT(m−1), and a source electrode connected to the voltage terminal V to receive the off-voltage VOFF.

The second transistor T2 includes a drain electrode connected to the first clock terminal CK1 to receive the first clock signal CKB, a gate electrode connected to the first input terminal IN1 to receive the (m−1)-th carry signal COUTm−1, and a source electrode connected to the first output terminal OUT.

The third transistor T3 includes a drain electrode and a gate electrode connected to the first clock terminal CK1 to receive the first clock signal CKB, and a source electrode connected to the second node N2, which also connects to the drain electrode of the first transistor T1 and the gate electrode of the tenth transistor T10.

Operation of the pre-charging part 300 will be briefly described now. The third transistor T3 is turned on in response to the first clock signal CKB, and a voltage of the second node N2 is thereby converted to a high level. Namely, where the first clock signal CKB has a high level, the voltage of the second node N2 is converted to the high level.

When the first transistor T1 is turned on in response to the (m−1)-th carry signal COUTm−1 provided to the first input terminal IN1, the second node N2 is discharged to the off-voltage VOFF and the tenth transistor T10 is turned off. Therefore, the first holding part 242 stops discharging the first output terminal OUT to the off-voltage VOFF.

When the first transistor T1 is turned on in response to the (m−1)-th carry signal COUTm−1, the second transistor T2 also turns on in response to the (m−1)-th carry signal COUTm−1 and outputs the high-level first clock signal CKB to the first output terminal OUT. Therefore, the pre-charging part 300 pre-charges the m-th gate signal GOUTm output to the first output terminal OUT by using the high-level first clock signal CKB. The high-level first clock signal CKB output to the first output terminal OUT is defined as a first pulse.

In the pre-charging part 300, the third transistor T3 may be employed to improve the turn-off effect of the tenth transistor T10, but the third transistor T3 of the pre-charging part 300 is optional. Namely, the tenth transistor T10 turns on or turns off in response to the first clock signal CKB, and the turn-off effect of the tenth transistor T10 can be reduced when the first clock signal CKB is directly applied to the tenth transistor T10. Therefore, the third transistor T3 operates as a diode and can improve the tenth transistor T10 turn-off effect.

The m-th stage SRCm may further include a third holding part 246 and a fourth holding part 248 that maintain the level of the first node N1 at the off-voltage VOFF.

The third holding part 246 includes a thirteenth transistor T13 having a gate electrode connected to the second clock terminal CK2, a drain electrode connected to the first node N1, and a source electrode connected to the first output terminal OUT.

The fourth holding part 248 includes a fourteenth transistor T14 having a gate electrode connected to the first clock terminal CK1, a drain electrode connected to the first input terminal IN1, and a source electrode connected to the first node N1.

The third holding part 246 and the fourth holding part 248 maintain the level of the first node N1 at the off-voltage VOFF after the m-th gate signal GOUTm is discharged to the off-voltage VOFF by the pull-down part 220. Therefore, the third holding part 246 and the fourth holding part 248 maintain the pull-up part 210 in the off state. Namely, when the thirteenth transistor T13 is turned on in response to the second clock signal CK, the level of the first output terminal OUT, which is discharged to the off-voltage VOFF, is applied to the first node N1 so the level of the first node N1 is discharged to the off-voltage. Also, when the fourteenth transistor T14 is turned on in response to the first clock signal CKB having a reversed phase to that of the second clock signal CK, the (m−1)-th carry signal COUTm−1 being discharged to the off-voltage VOFF and applied to the first input terminal, is applied to the first node N1 and the level of the first node N1 is discharged to the off-voltage VOFF.

Like this, the third holding part 246 and the fourth holding part 248 alternately turn the thirteenth transistor T13 and the fourteenth transistor T14 on to discharge a level of the first node N1 to the off-voltage VOFF.

The m-th stage SRCm of the gate driver 200 further includes a reset part 260 and a carry part 290.

The reset part 260 includes a sixteenth transistor T16 having a gate electrode connected to the reset terminal RE, a drain electrode connected to the first node N1, and a source electrode connected to the voltage terminal V to receive the off-voltage VOFF. The sixteenth transistor T16 is turned on by the (n+1)-th carry signal COUTn+1 of the final stage SRCn+1 provided to the reset terminal RE, and the voltage of the first node N1 is discharged to the off-voltage VOFF. Therefore, the m-th gate signal GOUTm is discharged to the off-voltage VOFF by the (n+1)-th carry signal COUTn+1.

The carry part 290 outputs the high-level second clock signal CK to the second output terminal CR in response to the level of the first node N1 to form the m-th carry signal COUTm. The carry part 290 includes a seventeenth transistor T17 having a gate electrode connected to the first node N1, a drain electrode connected to the second clock terminal CK2 to receive the second clock signal CK, and a source electrode connected to the second output terminal CR. The carry part 290 outputs the high-level second clock signal CK to the second output terminal CR in response to the level of the first node N1 after the (m−1)-th carry signal COUTm−1 is applied to the first node N1 and the third capacitor C3 is charged.

In the gate driver 200 according to the first exemplary embodiment of the present invention, the m-th gate signal GOUTm forms a first pulse before forming a second pulse defined as a gate-on signal. Therefore, the gate driver 200 can perform pre-charging and reduce a delay time in outputting a gate-on signal.

Figure 5:
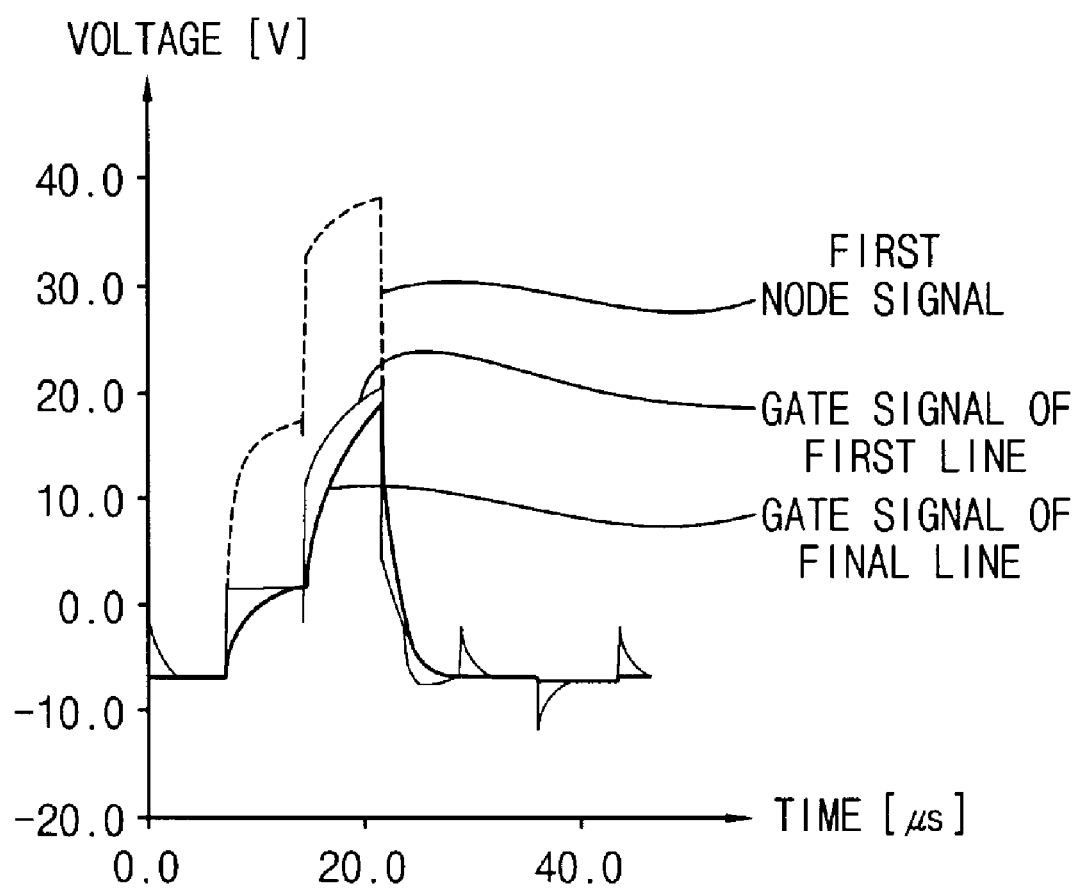
FIG. 5 is a graphic diagram explaining a simulation result of the stage shown in FIG. 3.

FIG. 5 is a graphic diagram explaining a simulation result of the stage shown in FIG. 3.

In FIG. 5, the gate-off signal level is about −7V and the gate-on signal level is about 20V.

As shown in FIG. 5, the voltage of the m-th gate signal GOUTm is maintained to be the gate-off signal level of about −7V and then is pre-charged to the first pulse level of about 2V, before forming the second pulse defined as the gate-on signal. Generally, a voltage range of the gate-on signal is from about −7V of the off-voltage VOFF to about 20V of the on-voltage, so that the gate-on signal has a variation of about 27V, if the pre-charging is not performed. On the other hand, if the pre-charging is performed, the voltage range of the gate-on signal is from about 2V of the off-voltage VOFF to about 20V of the on-voltage, so that the gate-on signal has a variation of about 18V. Namely, in the section where the gate-on signal is formed, the voltage variation is reduced by the pre-charging. Therefore, a voltage rising amount charged to the pull-up part 210, which controls the gate-on signal, is reduced and a charging margin is improved without an increase in power consumption or a high temperature noise defect.

Also, because the gate signal can be charged to a threshold voltage level of a thin film transistor, a charging time can be improved and a driving error resulting from an increase in driving frequency can be improved.

Figure 6:
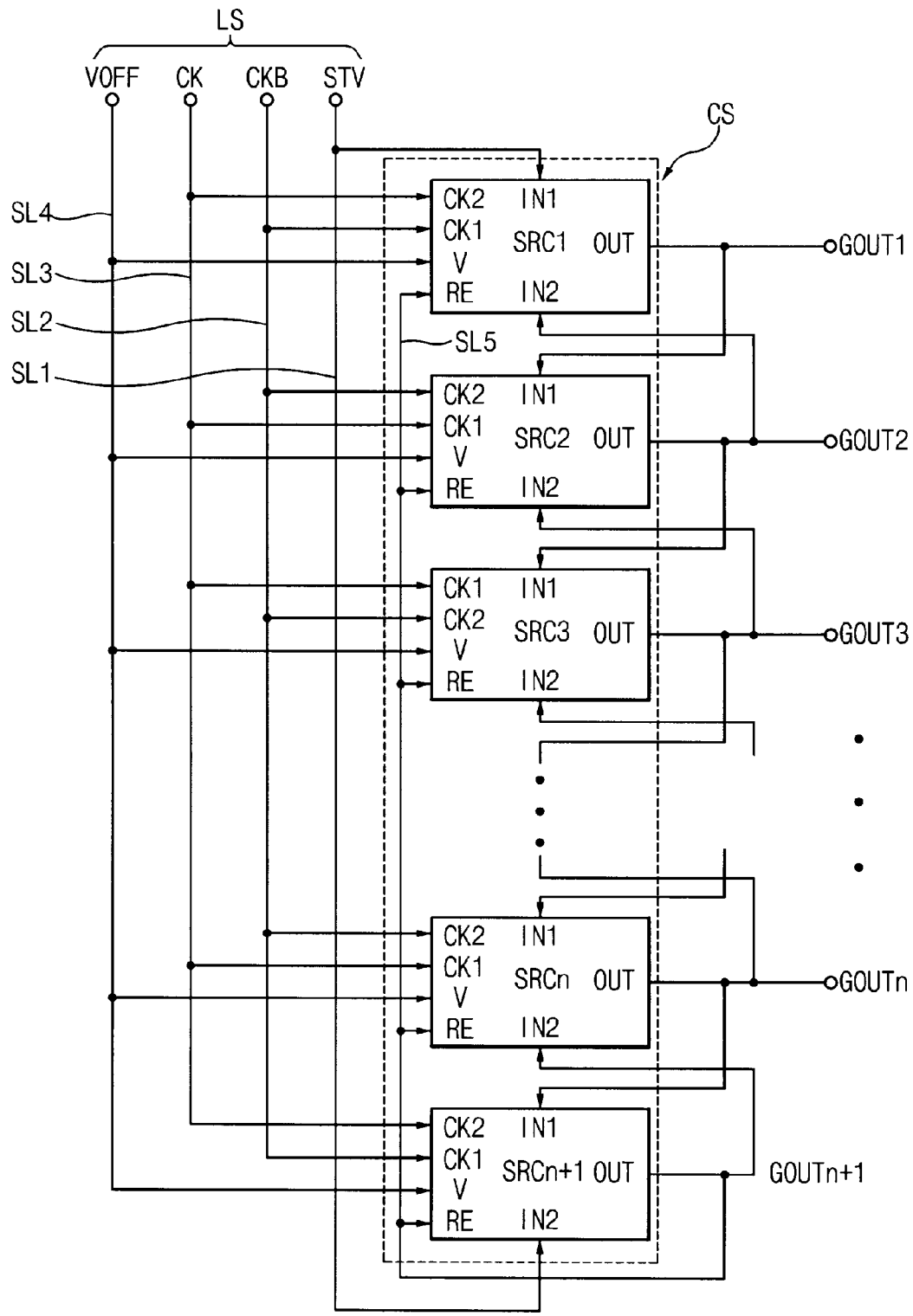
FIG. 6 is a block diagram of a gate driver having cascade-connected stages according to a second exemplary embodiment of the present invention.

FIG. 6 is a block diagram of a gate driver according to a second exemplary embodiment of the present invention.

The gate driver according to the second exemplary embodiment of the present invention is substantially similar to that of the first exemplary embodiment of the present invention. Thus, the same reference numerals will be used to refer to the same or substantially similar parts as those described in the first exemplary embodiment, and repetitive explanation concerning the above elements will be omitted.

Referring to FIG. 6, the gate driver 200 according to the second exemplary embodiment includes a circuit section CS and a line section LS. The circuit section CS includes first to (n+1)-th stages SRC1 to SRCn+1 that are cascade-connected to each other, for sequentially outputting a gate signal GOUT1 to GOUTn+1. The line section LS is arranged along an end of the circuit section CS and provides the circuit section CS with a synchronization signal and a driving voltage.

Each of the first to (n+1)-th stages SRC1 to SRCn+1 includes a first clock terminal CK1, a second clock terminal CK2, a first input terminal IN1, a second input terminal IN2, a voltage terminal V, a reset terminal RE, and a first output terminal OUT. Unlike in the gate driver according to the first exemplary embodiment of the present invention, the first to (n+1)-th stages SRC1 to SRCn+1 do not include a second output terminal CR.

The first clock terminal CK1 and the second clock terminal CK2 of the m-th stage SRCm receive the first clock signal CKB and the second clock signal CK having phases opposite to each other, wherein 'm' is a natural number equal to or less than n+1. The first clock signal CKB and the second clock signal CK alternate with each other by a period of 1 H.

The first input terminal IN1 of the m-th stage SRCm receives a vertical start signal STV or an output signal of the (m−1)-th stage SRCm-1 as a vertical start signal. Specifically, the vertical start signal STV is provided to the first input terminal IN1 of the first stage SRC1, and the (m−1)-th gate signal GOUTm−1 is provided as a vertical start signal to the first input terminal IN1 of the second to (n+1)-th stages SRC2 to SRCn+1.

The second input terminal IN2 of the m-th stage SRCm receives an output signal of the (m+1)-th stage SRCm+1 or the vertical start signal STV. Specifically, the vertical start signal STV is provided to the second input terminal IN2 of the (n+1)-th stage SRCn+1, and the (m+1)-th gate signal GOUTm+1 is provided as a vertical start signal to the second input terminal IN2 of the first to n-th stages SRC1 to SRCn.

The off-voltage VOFF is provided to the voltage terminal V of the m-th stage. The (n+1)-th gate signal GOUTn+1 of final stage SRCn+1 is provided to the reset terminal RE of the m-th stage SRCm.

The first output terminal OUT of the m-th stage SRCm outputs a high-level second clock signal CK or first clock signal CKB provided to the second clock terminal CK2.

The line section LS, which is arranged along an end of the circuit section CS, includes a start signal line SL1, a first clock line SL2, a second clock line SL3, a voltage line SL4, and a reset line SL5.

The start signal line SL1 receives the vertical start signal STV, and provides the first input terminal IN1 of the first stage SRC1 and the second input terminal IN2 of the (n+1)-th stage SRCn+1 with the vertical start signal STV.

The first clock line SL2 receives the first clock signal CKB, and the second clock line SL3 receives the second clock signal CK having the reversed phase to that of the first clock signal CKB. Then, the first clock line SL2 and the second clock line SL3 alternately provide the first clock terminal CK1 and the second clock terminal CK2 of the first to (n+1)-th stages SRC1 to SRCn+1 with the first clock signal CKB and the second clock signal CK.

The voltage line SL4 receives the off-voltage VOFF, and provides the off-voltage VOFF to the voltage terminal V of the first to (n+1)-th stages SRC1 to SRCn+1.

The reset line SL5 receives the (n+1)-th gate signal GOUTn+1 and provides the reset terminal RE of the first to (n+1)-th stages SRC1 to SRCn+1 with the (n+1)-th gate signal GOUTn+1.

In the gate driver according to the second exemplary embodiment of the present invention, the m-th stage SRCm of the gate driver 200 receives the gate signal GOUTm−1 of the (m−1)-th stage SCRm−1 instead of the (m−1)-th carry signal COUTm−1 of the (m−1)-th stage SCRm−1.

Figure 7:
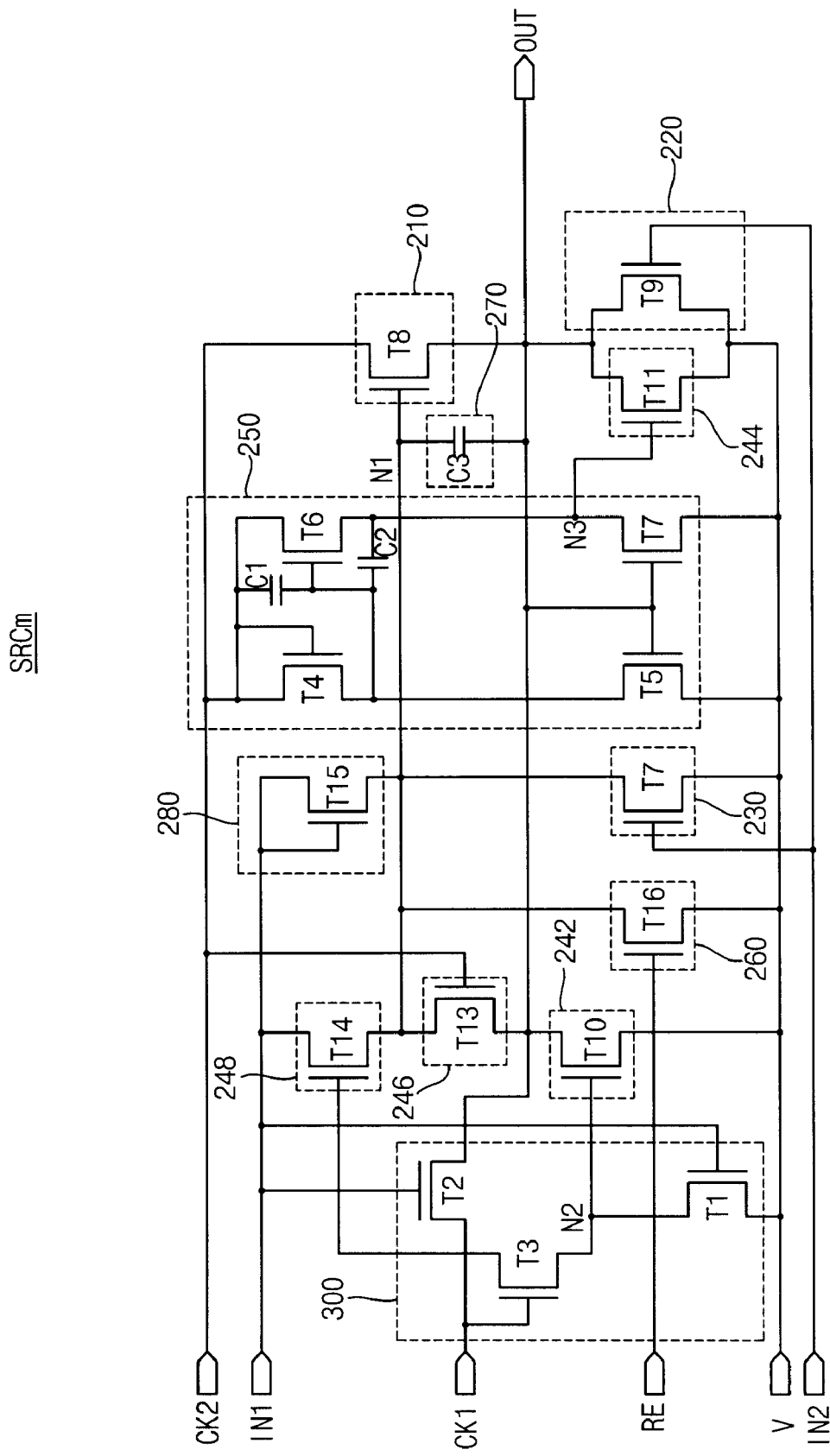
FIG. 7 is a circuit diagram of a stage shown in FIG. 6.
Figure 8:
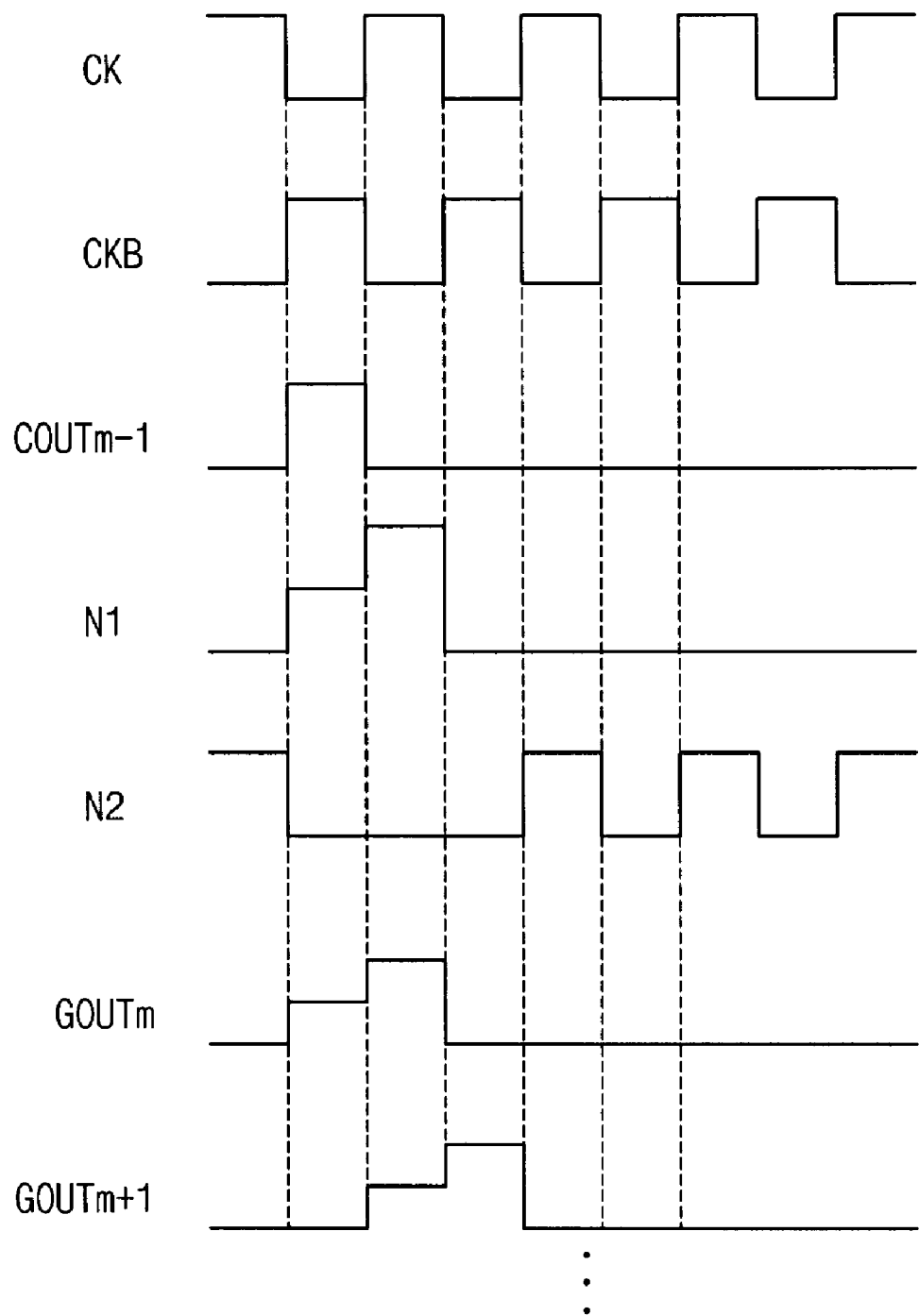
FIG. 8 is a signal waveform diagram for a stage shown in FIG. 7.

FIG. 7 is a circuit diagram of a stage shown in FIG. 6. FIG. 8 is a signal waveform diagram for a stage shown in FIG. 7.

The stage according to the second exemplary embodiment is similar to that of the first exemplary embodiment. Thus, the same reference numerals will be used to refer to the same or substantially similar parts as those described in the first exemplary embodiment, and repetitive explanation concerning the above elements will be omitted.

Referring to FIG. 7, the m-th stage SRCm according to the second exemplary embodiment of the present invention includes a pull-up part 210 and a pull-down part 220. The pull-up part 210 outputs a high-level second clock signal CK to the first output terminal OUT in response to the (m−1)-th gate signal GOUTm−1 and forms a second pulse referred to as the gate-on signal. The pull-down part 220 discharges the first output terminal OUT to the off-voltage VOFF in response to the (m+1)-th gate signal GOUTm+1.

The m-th stage SRCm further includes a pull-up driving part. The pull-up driving part turns on the pull-up part 210 in response to the (m−1)-th gate signal GOUTm−1, and turns off the pull-up part 210 in response to the (m+1)-th gate signal GOUTm+1. The pull-up driving part includes a buffer part 280, a charging part 270 and a discharging part 230.

The buffer part 280 applies the (m−1)-th gate signal GOUTm−1 to a first node N1 and charges the charging part 270, and then the buffer part 280 turns on the pull-up part 210 when the second clock signal CK has a high level. The discharging part 230 discharges the first node N1 (for example, the charging part) and turns off the pull-up part 210.

The m-th stage may further include a first holding part 242, a second holding part 244, and a switching part 250. The first holding part 242 and the second holding part 244 alternately maintain the m-th gate signal GOUTm at the off-voltage VOFF. The switching part 250 switches the second holding part 244 on and off.

The first holding part 242 is operated in response to a level of the second node N2 according to the first clock signal CKB. The second holding part 244 turns on and off in response to a level of the third node N3 connected to the switching part 250. The switching part 250 turns the second holding part 244 on and off in response to the second clock signal CK. The switching part 250 turns off the second holding part 244 when a signal of the first output terminal OUT has a high level, regardless of a level of the second clock signal CK.

The m-th stage further includes a pre-charging part 300. The pre-charging part 300 turns off the first holding part 242 in response to the (m−1)-th gate signal GOUTm−1, and outputs the high-level first clock signal CKB to the first output terminal OUT so that the pre-charging part 300 pre-charges the m-th gate signal GOUTm. The high-level first clock signal CKB, which is output to the first output terminal OUT by the pre-charging part 300, defines a first pulse of the m-th gate signal GOUTm.

The m-th stage further includes a third holding part 246 and a fourth holding part 248. The third holding part 246 and the fourth holding part 248 maintain the first node N1 connected to the gate electrode of the pull-up part 210 at the off-voltage VOFF. The third holding part 246 discharges the first node N1 to a level of the first output terminal OUT discharged to the off-voltage VOFF in response to the second clock signal CK. The fourth holding part 248 discharges the first node N1 to the (m−1)-th gate signal, which has a level of off-voltage VOFF, in response to the first clock signal CKB.

The m-th stage further includes a reset part 260. The reset part 260 discharges the first node N1 to the off-voltage VOFF in response to the (n+1)-th gate signal GOUTn+1, and turns off the pull-up part 210.

According to the present invention, the gate signal having a level of the off-voltage is pre-charged by the clock signal used to generate the gate-on signal. Therefore, a time for the gate signal to reach a threshold voltage may be reduced, and a drop defect of the gate signal may be decreased.

Also, a time that the data signal charges a pixel may be increased, so that a driving defect resulting from the increase of a driving frequency may be decreased.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A gate driver, comprising:
a shift register comprising an (m−1)-th stage, an m-th stage, and an (m+1)-th stage connected to each other, wherein the m-th stage comprises:
a first holding part to discharge a first output terminal to an off-voltage in response to a first clock signal;
a pre-charging part to turn off the first holding part and to directly output the first clock signal to the first output terminal in response to an output signal of the (m−1)-th stage;
a pull-up part to output a second clock signal to the first output terminal in response to the output signal of the (m−1)-th stage; and
a pull-down part to discharge the first output terminal to the off-voltage in response to an output signal of the (m+1)-th stage, wherein m is a natural number.

2. The gate driver of claim 1, wherein the first clock signal and the second clock signal alternate with each other by a period of 1 H, and have phases opposite to each other.

3. The gate driver of claim 2, wherein the pre-charging part comprises:
a first transistor to turn off the first holding part in response to the output signal of the (m−1)-th stage; and
a second transistor to output the first clock signal to the first output terminal in response to the output signal of the (m−1)-th stage.

4. The gate driver of claim 3, wherein the pre-charging part further comprises:
a third transistor to turn on the first holding part in response to the first clock signal.

5. The gate driver of claim 4, further comprising:
a second holding part to discharge the first output terminal to the off-voltage; and
a switching part to turn on the second holding part in response to the second clock signal.

6. The gate driver of claim 5, wherein the switching part turns off the second holding part when the second clock signal is output to the first output terminal.

7. The gate driver of claim 5, wherein the switching part comprises:
a fourth transistor comprising a drain electrode to receive the second clock signal and a gate electrode to receive the second clock signal;
a fifth transistor comprising a drain electrode connected to a source electrode of the fourth transistor, a gate electrode connected to the first output terminal, and a source electrode to receive the off-voltage;
a sixth transistor comprising a drain electrode to receive the second clock signal, and a gate electrode connected to the source electrode of the fourth transistor;
a seventh transistor comprising a drain electrode connected to a source electrode of the sixth transistor, a gate electrode connected to the first output terminal, and a source electrode to receive the off-voltage;
a first capacitor connecting the drain electrode of the sixth transistor to the gate electrode of the sixth transistor; and
a second capacitor connecting the gate electrode of the sixth transistor to the source electrode of the sixth transistor,
wherein the second holding part is turned on in response to a level of a node connected to the source electrode of the sixth transistor and the drain electrode of the seventh transistor.

8. The gate driver of claim 7, further comprising:
a discharging part to discharge a gate electrode of the pull-up part to the off-voltage in response to the output signal of the (m+1)-th stage;
a third holding part to maintain the gate electrode of the pull-up part at the off-voltage in response to the second clock signal; and
a fourth holding part to maintain the gate electrode of the pull-up part at the off-voltage in response to the first clock signal.

9. The gate driver of claim 8, wherein the output signal of the (m−1)-th stage is a vertical start signal output from a first output terminal of the (m−1)-th stage when the (m−1)-th stage is a first stage, and
the output signal of the (m+1)-th stage is the vertical start signal output from a first output terminal of the (m+1)-th stage when the (m+1)-th stage is a last stage.

10. The gate driver of claim 8, further comprising:
a carry part to output the second clock signal to a second output terminal in response to the output signal of the (m−1)-th stage.

11. The gate driver of claim 10, wherein the output signal of the (m−1)-th stage is a vertical start signal output from a second output terminal of the (m−1)-th stage when the (m−1)-th stage is a first stage, and the output signal of the (m+1)-th stage is the vertical start signal output from a first output terminal of the (m+1)-th stage when the (m+1)-th stage is a last stage.

12. A display apparatus, comprising:
a display panel comprising a peripheral area and a display area, the display area having a plurality of gate lines and data lines crossing each other, and a plurality of pixels electrically connected to the gate lines and the data lines;
a data driver to output a data signal to the data lines; and
a gate driver to output a gate signal comprising a first pulse and a second pulse to the gate lines, the gate driver being arranged in the peripheral area and comprising an (m−1)-th stage, an m-th stage, and an (m+1)-th stage connected together,
wherein the m-th stage comprises:
a first holding part to discharge a first output terminal to an off-voltage in response to a first clock signal;
a pre-charging part to turn off the first holding part and to directly output the first clock signal to the first output terminal to form the first pulse in response to an output signal of the (m−1)-th stage;
a pull-up part to output a second clock signal to the first output terminal to form the second pulse in response to the output signal of the (m−1)-th stage; and
a pull-down part to discharge the first output terminal to the off-voltage in response to an output signal of (m+1)-th stage, wherein m is a natural number.

13. The display apparatus of claim 12, wherein the first clock signal and the second clock signal alternate with each other by a period of 1 H, and have phases opposite to each other.

14. The display apparatus of claim 13, wherein the pre-charging part comprises:
a first transistor to turn off the first holding part in response to the output signal of the (m−1)-th stage; and
a second transistor to output the first clock signal to the first output terminal in response to the output signal of the (m−1)-th stage.

15. The display apparatus of claim 14, wherein the pre-charging part further comprises:
a third transistor to turn on the first holding part in response to the first clock signal.

16. The display apparatus of claim 15, further comprising:
a second holding part to discharge the first output terminal to the off-voltage; and
a switching part to turn on the second holding part in response to the second clock signal.

17. The display apparatus of claim 16, wherein the switching part turns off the second holding part when the second clock signal is output to the first output terminal.

18. The display apparatus of claim 16, wherein the switching part comprises:
a fourth transistor comprising a drain electrode and a gate electrode to receive the second clock signal;
a fifth transistor comprising a drain electrode connected to a source electrode of the fourth transistor, a gate electrode connected to the first output terminal, and a source electrode to receive the off-voltage;
a sixth transistor comprising a drain electrode to receive the second clock signal and a gate electrode connected to the source electrode of the fourth transistor;
a seventh transistor comprising a drain electrode connected to a source electrode of the sixth transistor, a gate electrode connected to the first output terminal, and a source electrode to receive the off-voltage;
a first capacitor connecting the drain electrode of the sixth transistor to the gate electrode of the sixth transistor; and
a second capacitor connecting the gate electrode of the sixth transistor to the source electrode of the sixth transistor,
wherein the second holding part is turned on in response to a level of a node connected to the source electrode of the sixth transistor and the drain electrode of the seventh transistor.

19. The display apparatus of claim 18, further comprising:
a discharging part to discharge a gate electrode of the pull-up part to the off-voltage in response to the output signal of the (m+1)-th stage;
a third holding part to maintain the gate electrode of the pull-up part at the off-voltage in response to the second clock signal; and
a fourth holding part to maintain the gate electrode of the pull-up part at the off-voltage in response to the first clock signal.

20. The display apparatus of claim 19, wherein the output signal of the (m−1)-th stage is a vertical start signal output from a first output terminal of the (m−1)-th stage when the (m−1)-th stage is a first stage, and
the output signal of the (m+1)-th stage is the vertical start signal output from a first output terminal of the (m+1)-th stage when the (m+1)-th stage is a last stage.

21. The display apparatus of claim 19, further comprising:
a carry part to output the second clock signal to the second output terminal in response to the output signal of the (m−1)-th stage.

22. The display apparatus of claim 21, wherein the output signal of the (m−1)-th stage is a vertical start signal output from a second output terminal of the (m−1)-th stage when the (m−1)-th stage is a first stage, and
the output signal of the (m+1)-th stage is the vertical start signal output from a first output terminal of the (m+1)-th stage when the (m+1)-th stage is a last stage.

* * * * *